(12) United States Patent
Hsu et al.

(10) Patent No.: US 10,386,484 B2
(45) Date of Patent: *Aug. 20, 2019

(54) OPTICAL APPARATUS AND LIGHT SENSITIVE DEVICE WITH MICRO-LENS

(71) Applicant: PixArt Imaging Inc., Hsin-Chu County (TW)

(72) Inventors: En-Feng Hsu, Hsin-Chu County (TW); Chia-Yu Liu, Hsin-Chu County (TW); Ching-Wei Chen, Hsin-Chu County (TW)

(73) Assignee: PIXART IMAGING INC., Hsin-Chu County (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/956,313

(22) Filed: Apr. 18, 2018

(65) Prior Publication Data
US 2018/0239018 A1    Aug. 23, 2018

Related U.S. Application Data

(63) Continuation of application No. 14/145,019, filed on Dec. 31, 2013, now Pat. No. 9,989,640.

(30) Foreign Application Priority Data

Jan. 11, 2013  (TW) .............................. 102101275 A
May 28, 2013 (TW) .............................. 102118898 A

(51) Int. Cl.
*G01S 17/02* (2006.01)
*H01L 31/0232* (2014.01)
*G01S 7/481* (2006.01)

(52) U.S. Cl.
CPC .......... *G01S 17/026* (2013.01); *G01S 7/4813* (2013.01); *H01L 31/02325* (2013.01)

(58) Field of Classification Search
CPC . G01S 17/026; G01S 7/4813; H01L 31/02325
See application file for complete search history.

(56) References Cited

U.S. PATENT DOCUMENTS 9,989,640 B2 * 6/2018 Hsu ....................... G01S 17/026

* cited by examiner

*Primary Examiner* — Georgia Y Epps
*Assistant Examiner* — Don J Williams
(74) *Attorney, Agent, or Firm* — WPAT, PC

(57) ABSTRACT

There is provided an optical apparatus including a substrate, a light emitting device, a light sensitive device and a plurality of micro-lenses. The light emitting device is disposed on the substrate and adapted to provide a light beam. The light sensitive device is disposed on the substrate and adapted to receive a light beam reflected from an object, wherein the light sensitive device has a plurality of photosensitive units arranged in matrix. The micro-lenses are disposed above the light sensitive device and respectively opposite to the associated photosensitive units. There is further provided a light sensitive device with micro-lens and a manufacturing method thereof.

20 Claims, 12 Drawing Sheets

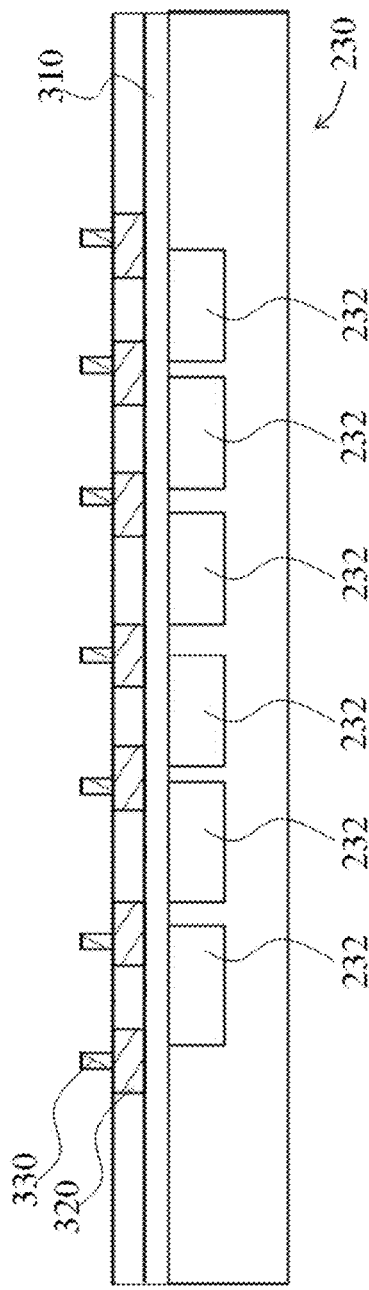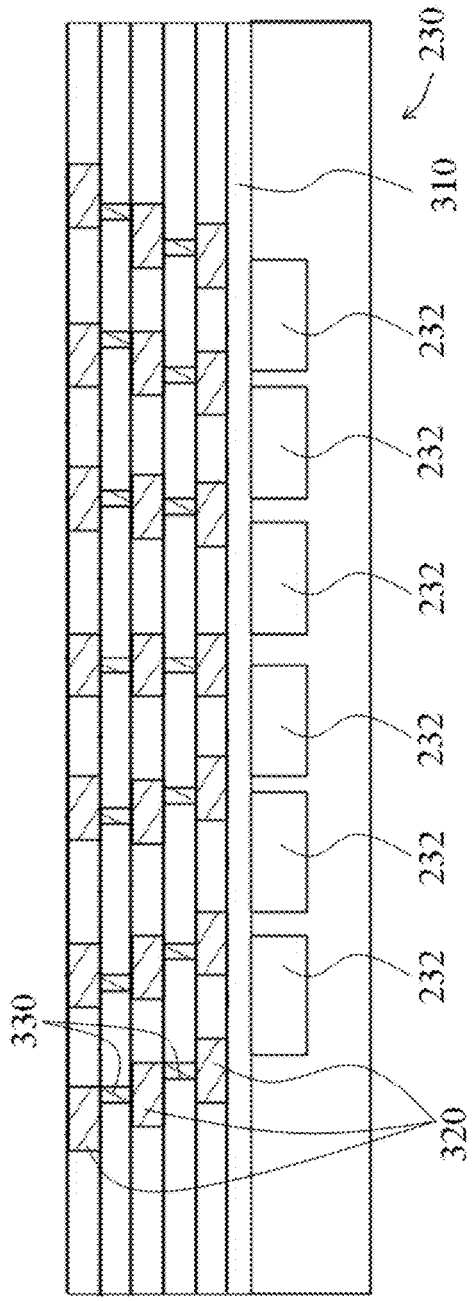

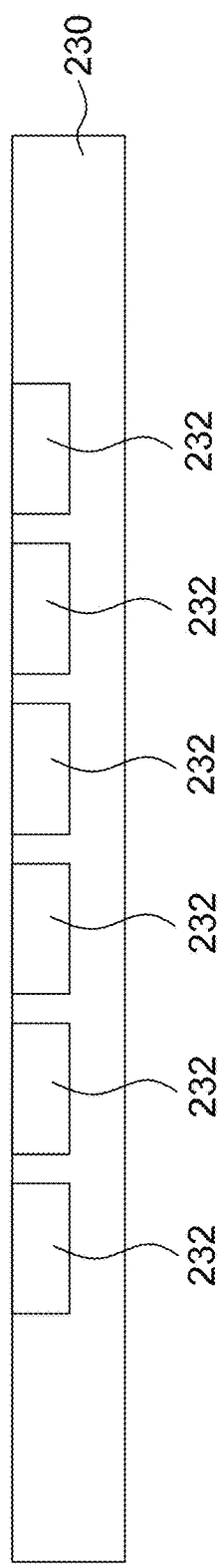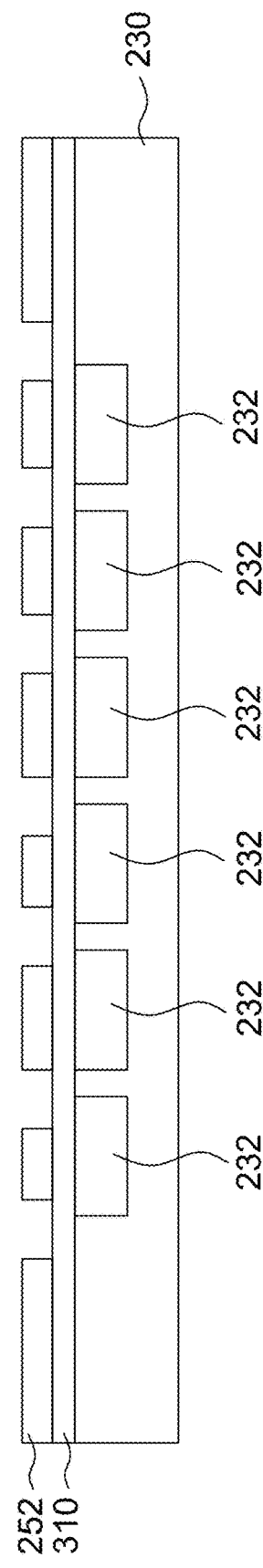

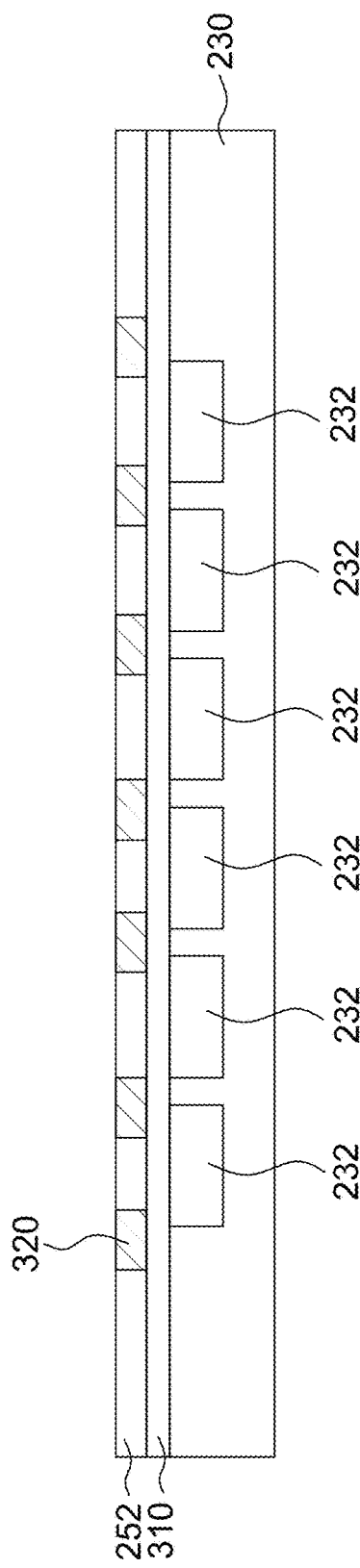
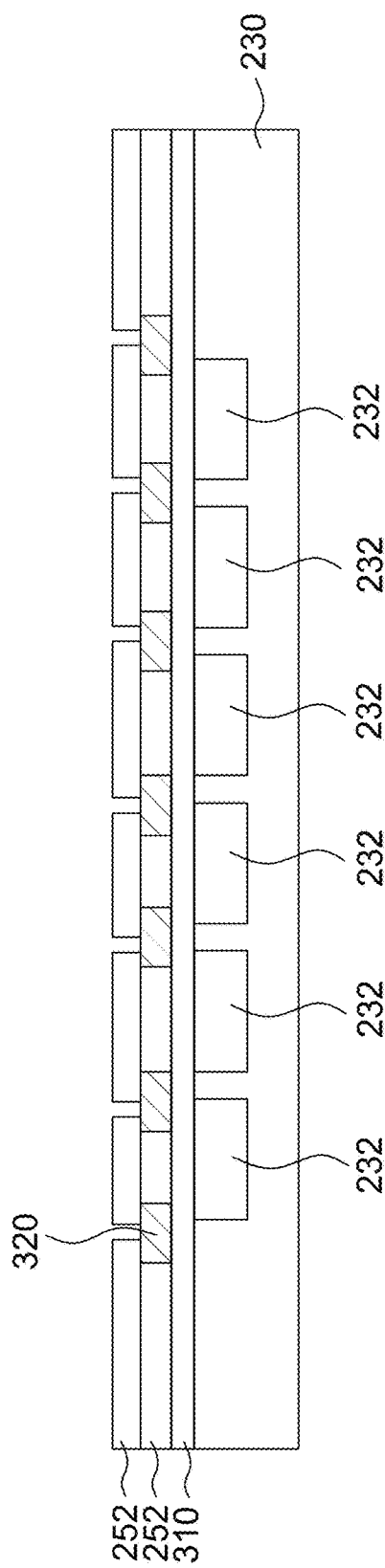

OPTICAL APPARATUS AND LIGHT SENSITIVE DEVICE WITH MICRO-LENS

CROSS REFERENCE TO RELATED APPLICATION

This application is a continuation application of U.S. application Ser. No. 14/145,019, filed on Dec. 31, 2013, which claims the priority benefit of Taiwan Patent Application Serial Number 102101275, filed on Jan. 11, 2013 and Taiwan Patent Application Serial Number 102118898, filed on May 28, 2013, the full disclosure of which are incorporated herein by reference.

BACKGROUND

1. Field of the Disclosure

This disclosure generally relates to an optical apparatus and, more particularly, to an optical apparatus having the advantages of compact, low cost and easy fabrication.

2. Description of the Related Art

FIG. 1A show a schematic diagram of sensing the gesture movement by the conventional optical apparatus and FIG. 1B shows a cross-sectional view of the optical apparatus 100 of FIG. 1A. Please referring to FIGS. 1A and 1B together, the optical apparatus 100 includes a package housing 110, a light emitting device 120, a light sensitive device 130 and a condensing lens 140. The package housing 110 has a light outlet 112 and a light inlet 114, wherein a light beam L0 generated by the light emitting device 120 inside the package housing 110 ejects from the light outlet 112 and the light sensitive device 130 inside the package housing 110 is adapted to receive a light beam L1 reflected from a moving object 101 through the light inlet 114 so as to form an image. In addition, the condensing lens 140 is placed at the light inlet 114 and configured to collect the light beam L1 reflected by the moving object 101 and to image on the light sensitive device 130.

The traditional optical apparatus 100 mainly utilizes a single condensing lens 140 to image such that a total thickness of the optical apparatus 100 can not further be decreased. Generally speaking, it is possible to reduce the total thickness by adopting the Fresnel lens, but the total cost of the optical apparatus 100 can not be effectively reduced.

SUMMARY

The present disclosure provides an optical apparatus having the advantages of compact, low cost and easy fabrication.

The present disclosure further provides a light sensitive device with micro-lens and a manufacturing method thereof that may be adapted to the above optical apparatus and has the same advantages.

Other objects and advantages of the present disclosure will become more apparent from the following detailed technical features.

In order to achieve one, a part of or all objects above or other objects, the present disclosure provides an optical apparatus including a substrate, a light emitting device, a light sensitive device and a light blocking stack layer. The light emitting device is disposed on the substrate and configured to provide a light beam. The light sensitive device includes a plurality of photosensitive units arranged in matrix and has a matrix center. The light sensitive device is disposed on the substrate and configured to receive a reflected light beam formed by the object reflecting the light beam. The light blocking stack layer is disposed on the light sensitive device and includes at least two patterned metal layers, wherein a plurality of light passages associated with the photosensitive units is formed in the at least two patterned metal layers, the plurality of light passages inclines toward a direction away from the matrix center of the light sensitive device to limit an incident angle of the reflected light beam impinging on the photosensitive units, and tilt angles of some light passages arranged different from tilt angles of other light passages among the plurality of light passages. The tilt angles of light passages farther from the matrix center of the light sensitive device are larger than the tilt angles of light passages closer to the matrix center of the light sensitive device thereby increasing sensing efficiency in specific angles.

The present disclosure further provides a light sensitive device with micro-lens including a plurality of photosensitive units, a light blocking stack layer and a plurality of micro-lenses. The plurality of photosensitive units is arranged in a matrix which has a center. The light blocking stack layer includes at least two patterned metal layers forming on the photosensitive units to form a plurality of light passages associated with the photosensitive units respectively, wherein a part of the plurality of light passages has a tilt angle toward a direction away from the center of the matrix, and tilt angles of some light passages arranged different from tilt angles of other light passages among the part of the plurality of light passages. The tilt angles of the part of the plurality of light passages farther from the center of the matrix are larger than tilt angles of the part of the plurality of light passages closer to the center of the matrix thereby increasing sensing efficiency in specific angles. The plurality of micro-lenses is disposed on the light blocking stack layer and opposite to the light passages, respectively.

The present disclosure further provides a light sensitive device including a plurality of photosensitive units and a light blocking stack layer. The plurality of photosensitive units is arranged in a matrix and having a matrix center. The light blocking stack layer is disposed on the plurality of photosensitive units and includes at least two patterned metal layers, wherein a plurality of light passages associated with the photosensitive units is in the at least two patterned metal layers. First light passages among the plurality of light passages are arranged at a center area of the matrix, and the first light passages do not have an tile angle. Second light passages among the plurality of light passages are arranged outside of the center area and incline toward a direction away from the matrix center. Tilt angles of some light passages arranged different from tilt angles of other light passages among the second light passages, and the tilt angles of light passages farther from the matrix center are larger than the tilt angles of light passages closer to the matrix center among the second light passages thereby increasing sensing efficiency in specific angles.

In every embodiment of the present disclosure, the optical apparatus further includes a light blocking stack layer disposed on the light sensitive device, wherein the light blocking stack layer includes a plurality of light passages associated with the photosensitive units. The light passages have a tilt angle inclined toward a direction away from a center of the light sensitive device and are configured to limit an incident angle of the reflected light beam impinging on the photosensitive units.

In every embodiment of the present disclosure, the light blocking stack layer is positioned between the micro-lenses and the light sensitive device.

As mentioned above, the optical apparatus of the present disclosure may include corresponded micro-lenses disposed above the light sensitive device so as to prevent the use of the conventional single lens such that the fabrication of the optical apparatus is easier and the total size of the optical apparatus is reduced thereby effectively reducing the manufacturing cost of the optical apparatus. Furthermore, in the optical apparatus of the present disclosure a light blocking stack layer is stacked around adjacent photosensitive units so as to limit the incident angle of reflected light beams impinging on every photosensitive unit so as to achieve the function of identifying the object movement and reduce interferences of stray light or light leakage, wherein each of the photosensitive units may include one or a plurality of photodiodes.

BRIEF DESCRIPTION OF THE DRAWINGS

Other objects, advantages, and novel features of the present disclosure will become more apparent from the following detailed descriptions when taken in conjunction with the accompanying drawings.

FIGS. 3A-3D show schematic diagrams of the manufacturing method of the light sensitive device with micro-lens according to the embodiment of the present disclosure.

FIGS. 4A-4E show other schematic diagrams of the manufacturing method of the light sensitive device with micro-lens according to the embodiment of the present disclosure.

DETAILED DESCRIPTION OF THE EMBODIMENT

The above or other technical contents, characteristics and effects according to the present disclosure will become more apparent from the following detailed description of a preferred embodiment in conjunction with the accompanying drawings. It is to be understood that terms of direction used herein, such as upward, downward, leftward, rightward, forward and backward, are only used for reference but not used to limit the present disclosure.

Figure 1A:
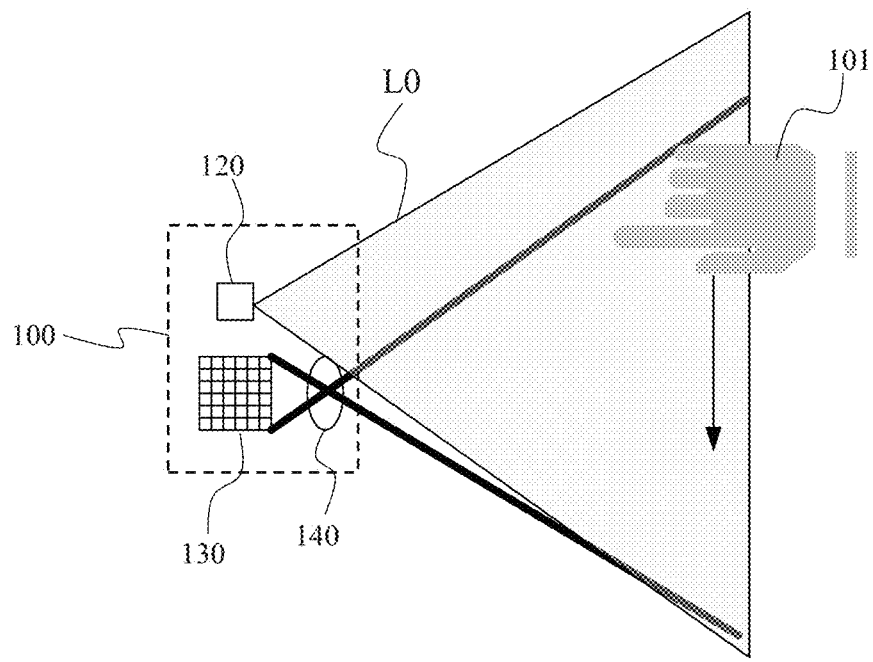
FIG. 1A shows a schematic diagram of sensing the gesture movement by the conventional optical apparatus.
Figure 1B:
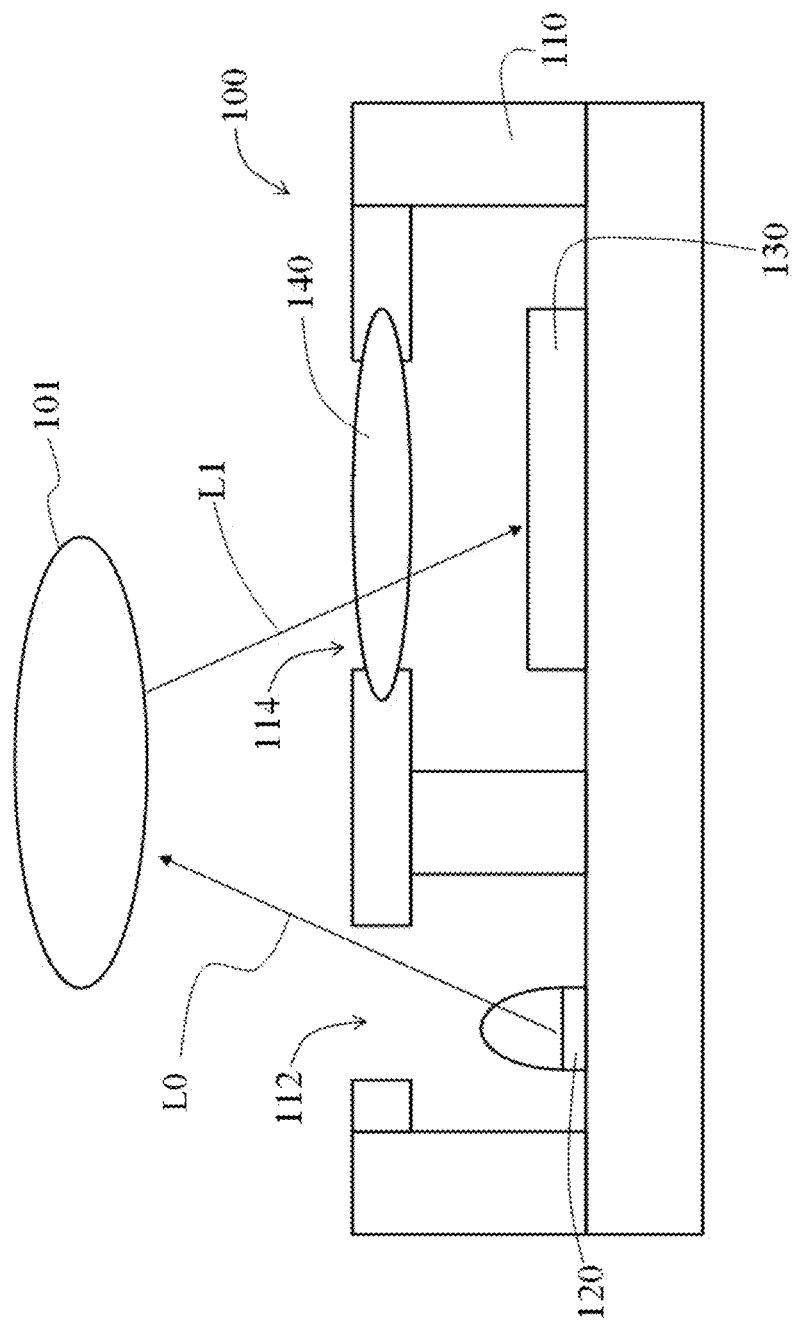
FIG. 1B shows a cross-sectional view of the optical apparatus of FIG. 1A.
Figure 2A:
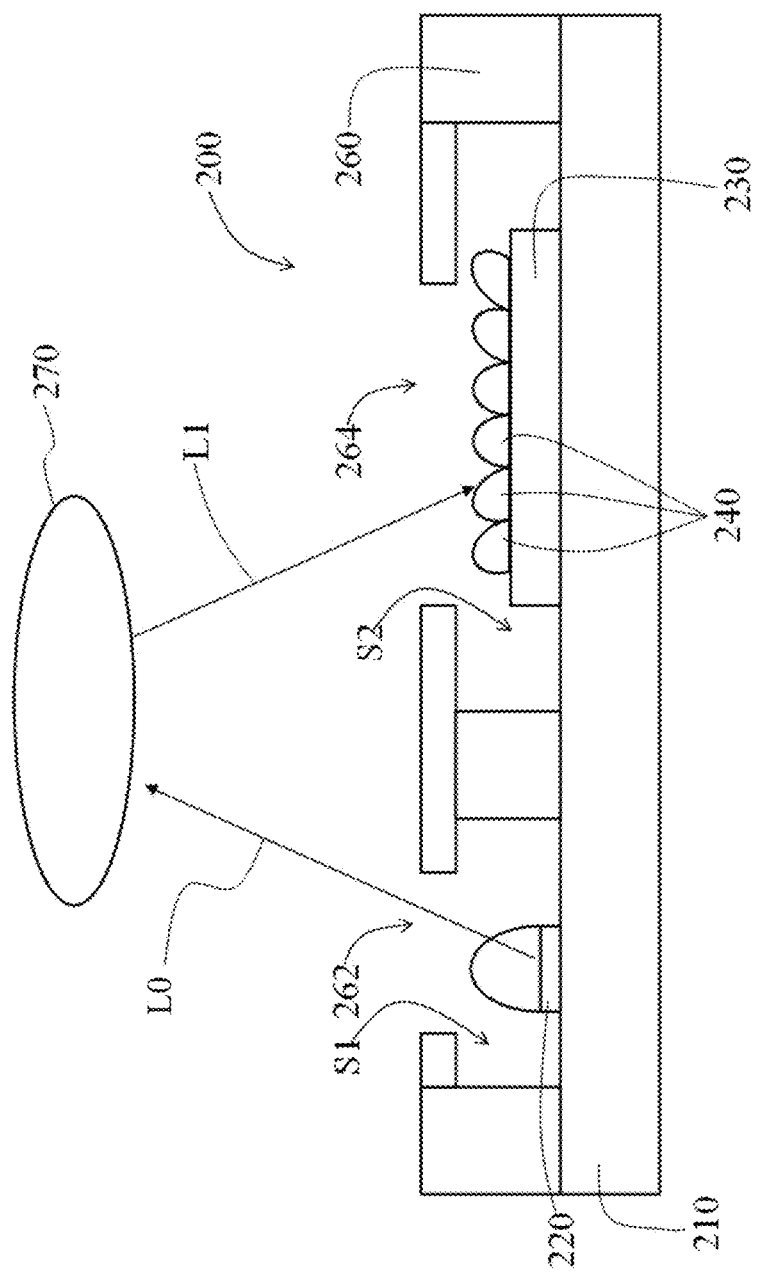
FIG. 2A shows a cross-sectional view of the optical apparatus according to an embodiment of the present disclosure.
Figure 2B:
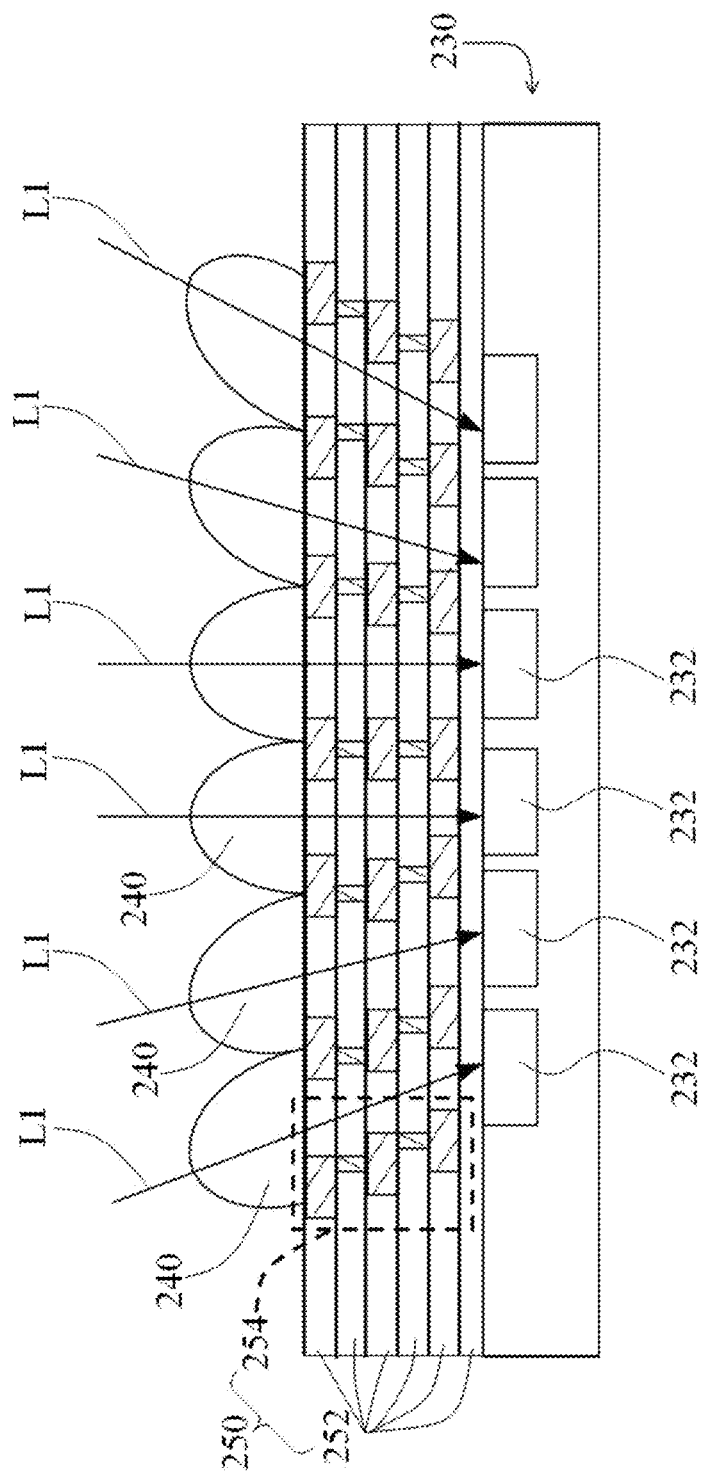
FIG. 2B shows a partial enlarged diagram of the optical apparatus of FIG. 2A.
Figure 2C:
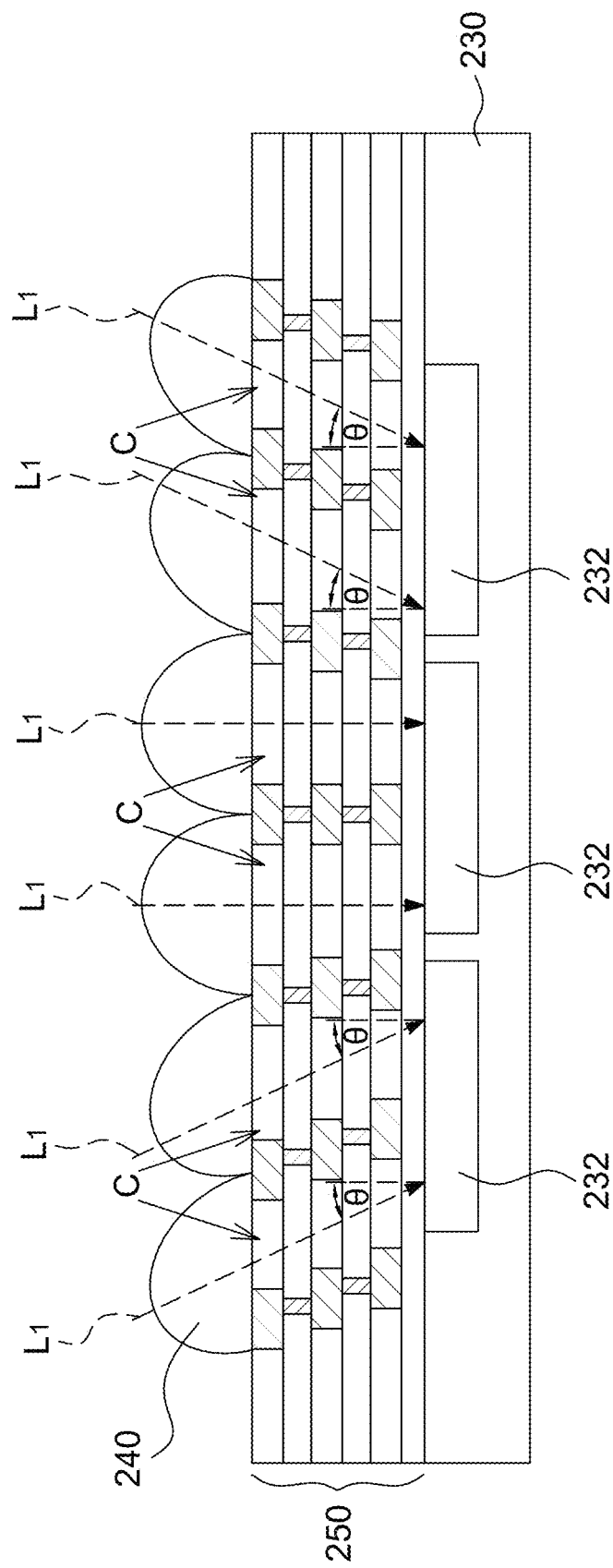
FIG. 2C shows another partial enlarged diagram of the optical apparatus of FIG. 2A.

FIG. 2A shows a cross-section view of the optical apparatus according to an embodiment of the present disclosure and FIGS. 2B and 2C show partial enlarged diagrams of the optical apparatus of FIG. 2A. Referring to FIGS. 2A, 2B and 2C together, the optical apparatus 200 of this embodiment includes a substrate 210, a light emitting device 220, a light sensitive device 230 and a plurality of micro-lenses 240, wherein the optical apparatus 200 is configured to detect an object 270. The light emitting device 220 and the light sensitive device 230 may be disposed on the substrate 210 and electrically connected to the substrate 210 as shown in FIG. 2A. In another embodiment not shown, the light emitting device 220 and the light sensitive device 230 may be respectively disposed on different substrates, and FIG. 2A is only intended to show an embodiment but not to limit the present disclosure.

In this embodiment, the substrate 210 may be a hard circuit board, a flexible circuit board or a lead frame that may be designed differently according to different requirements and thus FIG. 2A is not to limit the present disclosure. In addition, the light emitting device 220 is adapted to provide a light beam L0, wherein the light emitting device 220 may include a light emitting diode and the light beam L0 provided by the light emitting device 220 may have a wavelength of invisible light, e.g. infrared light or UV light. The infrared light may be used as an example herein, but the present disclosure is not limited thereto. In other embodiments, the light emitting device 220 may be other suitable active light sources. In this embodiment, the light sensitive device 230 may include a CCD image sensor or a CMOS image sensor, wherein a CMOS sensor is used as an embodiment herein. The light sensitive device 230 is adapted to receive a reflected light beam L1 formed by the object 270 reflecting the light beam L0.

Specifically speaking, the light sensitive device 230 includes a plurality of photosensitive units 232 arranged in matrix, wherein each of the photosensitive units 232 may include at least one photodiode configured to convert optical energy to electric signals, and a light blocking stack layer 250 is staked around the photosensitive units 232. The light blocking stack layer 250 is disposed on the light sensitive device 230, wherein the light blocking stack layer 250 includes a plurality of light passages C (as shown in FIG. 2C) respectively associated with the photosensitive units 232. The light passages C have a tilt angle θ inclined toward a direction away from a center of the light sensitive device 230 and are configured to limit an incident angle (i.e. the incident angle is equal to the tilt angle) of the reflected light beam L1 impinging on the photosensitive units 232. Accordingly, the light sensitive device 230 may achieve the function of identifying the object movement and decrease interferences from stray light or light leakage as shown in FIGS. 2B and 2C. More specifically speaking, the light blocking stack layer 250 may include a transparent material layer 252 and an opaque stack layer 254, wherein the transparent material layer 252 is covered on the photosensitive units 232 to be served as the light passages C through which the reflected light beam L1 impinges on the photosensitive units 232, and the opaque stack layer 254 inside the light blocking stake layer 250 is configured to limit the incident angle θ of the reflected light beam L1 impinging on the photosensitive units 232. The light blocking stack layer 250 may be manufactured by the traditional semiconductor etching process and thus details thereof are not described herein. The opaque stack layer 254 may be made of metal or non-mental materials (the metal material is used as an embodiment herein). In addition, in order to prevent the reflected light beam L1 from being reflected by the opaque stack layer 254 during impinging onto the photosensitive units 232, the opaque stack layer 254 is preferably made of light absorption materials. In addition, in order to allow the photosensitive units 232 to receive the reflected light beam L1 from a specific angle thereby increasing the sensing efficiency, the tilt angle θ of the light passages is preferable positively correlated with a distance between the light passages and a center of the light sensitive device 230 such that the incident angle of the reflected light beam L1 received by the photosensitive units 232 is positively correlated with a distance between the light passages and a center of the light sensitive device 230; that is, the light passages closer to the edge of the light sensitive device 230 may have a larger tilt angle θ inclined outwardly such that the associated photosensitive units 232 may receive the reflected light beam L1 having a larger incident angle.

In addition, the micro-lenses 240 are disposed above the light sensitive device 230 and respectively opposite to the photosensitive units 232 as shown in FIG. 2A; that is, if the micro-lenses 240 have good light guiding effect, the light blocking stack layer 250 may not be implemented. When the optical apparatus 200 of this embodiment includes the light blocking stack layer 250, the micro-lenses 240 are disposed on the light blocking stack layer 250 and respectively opposite to the light passages C such that the light blocking stack layer 250 is between the micro-lenses 240 and the light sensitive device 230. More specifically, at least one micro-lens having different angles may be disposed above each of the photosensitive units 232 of this embodiment such that different photosensitive units 232 may have different light receiving angles as shown in FIG. 2B. In this manner, a traditionally used single large lens is no longer necessary. The light sensitive device 230 may effectively detect the movement of the object, the total thickness or size of the optical apparatus 200 is effectively reduced, the manufacturing cost is lowered and the fabrication becomes easier (without the fabrication of the single lens). In other words, the optical apparatus 200 may include corresponded micro-lenses 240 disposed above the light sensitive device 230 so as to prevent the use of the conventional single lens thereby facilitating the fabrication, reducing the total size and manufacturing cost effectively.

In the embodiment of FIG. 2B, each photosensitive unit 232 is shown to be associated with one micro-lens 240 and one light passage. In another embodiment, as shown in FIG. 2C, when the photosensitive units 232 have a larger size, each photosensitive unit 232 may be associated with a plurality of identical or different micro-lenses 240 and a plurality of light passages C. For example, FIG. 2C shows that each photosensitive unit 232 is associated with two micro-lenses 240 and two light passages C so as to solve the difficulty of manufacturing a larger micro-lens 240 on a larger photosensitive unit 232 and improve the signal intensity. Specifically, the manufactured size of the micro-lenses 240 is small and if the photosensitive units 232 have a larger size, more than one micro-lenses 240 may be formed above one photosensitive unit 232 so as to allow the light to be effectively collected. In other words, the number of the micro-lenses 322 and the light passages C formed above one photosensitive unit 232 may be determined according to the size of the photosensitive units 232 as well as the manufacturing accuracy of forming the micro-lenses 232 above the photosensitive units 232. The above descriptions are only intended to illustrate but not to limit the present disclosure. For example in one embodiment, when each photosensitive unit 232 is associated with a plurality of light passages C and a plurality of micro-lenses 240, the light passages C opposite to the same photosensitive unit 232 may have identical tilt angles θ and the micro-lenses 240 opposite to the same photosensitive unit 232 may have identical light collecting angles so as to limit the incident angle of the reflected light beams L1 to be identical as shown in FIG. 2C.

In addition, the optical apparatus 200 may further include a package housing 260, wherein the package housing 260 may be disposed on the substrate 210 and have a light outlet 262 and a light inlet 264. In this embodiment, a first accommodation space S1 and a second accommodation space S2 are formed when the package housing 260 is disposed on the substrate 210, wherein the light emitting device 220 may be contained in the first accommodation space S1 and the light sensitive device 230 may be contained in the second accommodation space S2 as shown in FIG. 2A. The light beam L0 provided by the light emitting device 220 in the first accommodation space S1 propagates outward through the light outlet 262 and the light sensitive device 230 in the second accommodation space S2 may receive the reflected light beam L1 reflected by an object 270 through the light inlet 264. In should be mentioned that the package housing 260 may be integrated with or physically separated from the substrate 210 according to different manufacturing processes and the drawing shown herein is only intended to illustrate but not to limit the present disclosure.

Figure 3A:
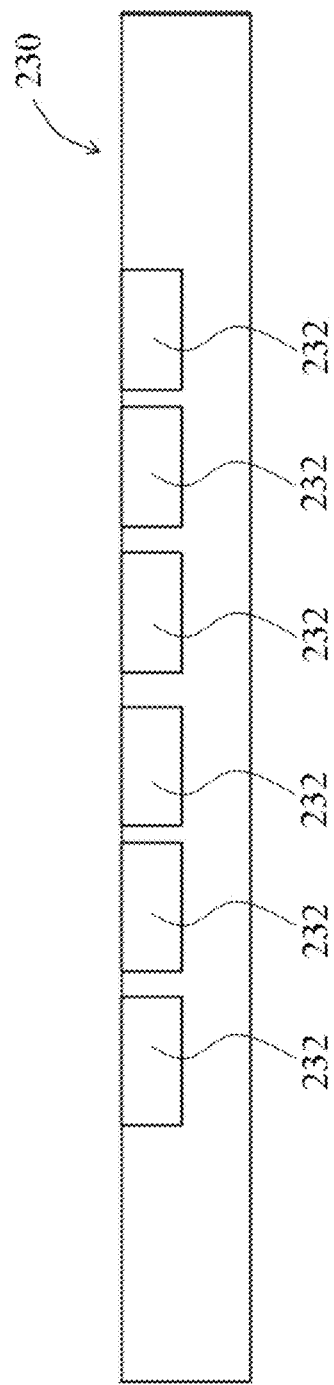
Figure 3B:
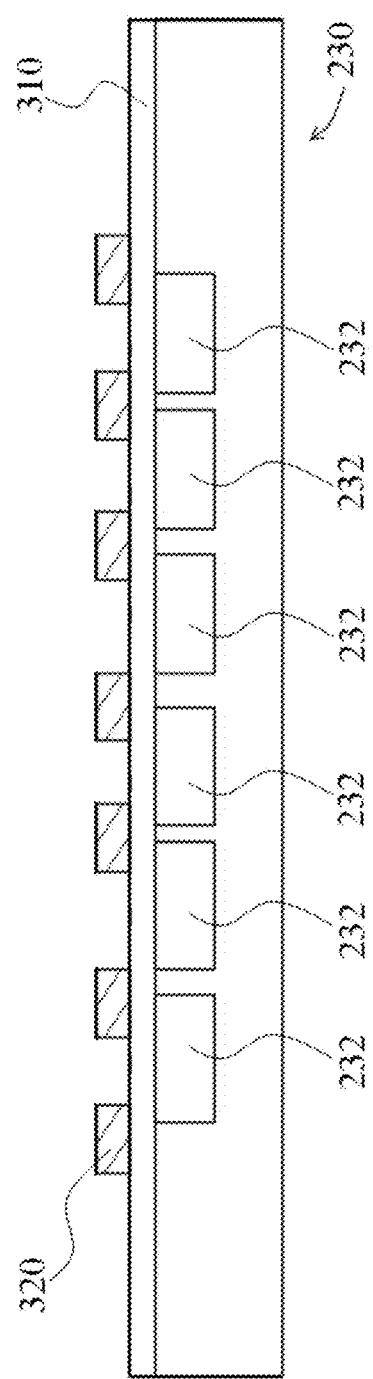
Figure 4E:
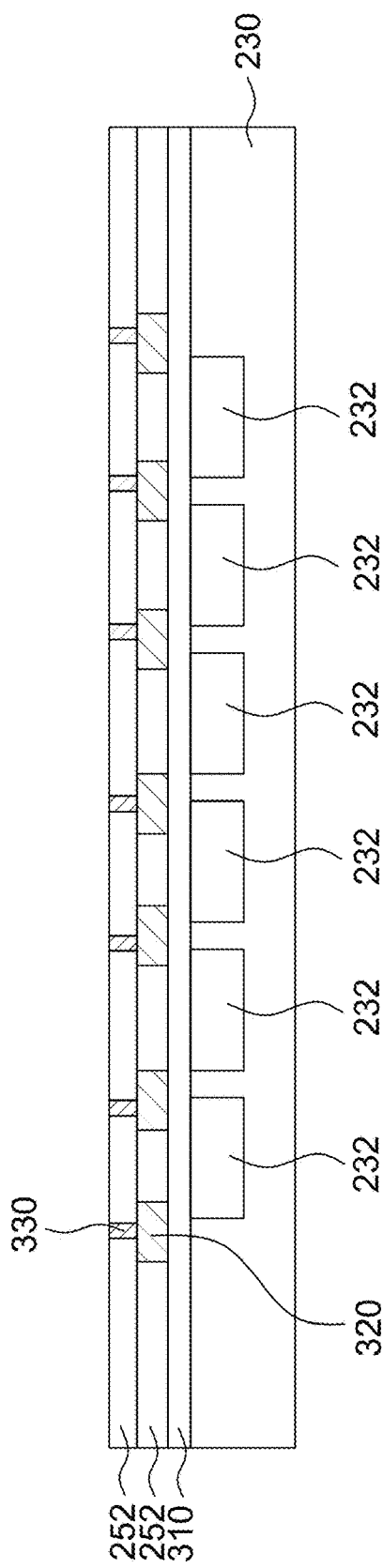

FIGS. 3A-3D show schematic diagrams of the manufacturing method of the light sensitive device with micro-lens of FIG. 2B. Referring to FIG. 3A at first, a light sensitive device 230 mentioned above is provided at first, wherein the light sensitive device 230 may be a CMOS image sensor and include a plurality of photosensitive units 232 arranged in matrix, e.g. a rectangular matrix having a oblong shape or a square shape. Next, a protection layer 310 is formed on the light sensitive device 230 as shown in FIG. 3B, wherein the protection layer 310 may be made of the dielectric material. Then, at least two layers of patterned metal layers are formed on the protection layer 310 so as to form a plurality of light passages that are associated with the photosensitive units 232 respectively. As mentioned above a part of the light passages C (e.g. the light passages not at a center of the light sensitive device 230) may have a tilt angle inclined toward a direction away from a center of the light sensitive device 230, and the value of the tilt angle is positively correlated with a distance between the light passages and the center of the light sensitive device 230. In addition, the light passage(s) C located at the center (e.g. a matrix center of the photosensitive units 232) of the light sensitive device 230 may not have the tilt angle and are configured to receive the reflected light beam L1 from a normal direction of the light sensitive device 230 as shown in FIGS. 2B and 2C.

The method of forming the patterned metal layers may be, for example, forming a first patterned metal layer 320 as shown in FIG. 3B, wherein the first patterned metal layer 320 may be formed by using the traditional semiconductor photolithography technique; and then forming a second patterned metal layer 330 on the first patterned metal layer 320 as shown in FIG. 3C, wherein the second patterned metal layer 330 may be formed by using the traditional semiconductor photolithography technique. Then, the steps of stacking the first patterned metal layer 320 and second patterned metal layer 330 may be repeated sequentially so as to form the embodiment shown in FIG. 3D. Finally, the micro-lenses 240 mentioned above are formed above the light sensitive device 230 and opposite to the light passages respectively. In this way, the process of forming the micro-lenses 240 above the light sensitive device 230 as shown in FIG. 2B is accomplished. It should be mentioned that the stacked first patterned metal layers 320 and second patterned metal layers 330 are served as the opaque stack layer 254 aforementioned and the transparent material layer 252 is served as the light passages C.

In addition, referring to FIGS. 4A-4E, they show other schematic diagrams of the manufacturing method of the light sensitive device with micro-lens of FIG. 2B in which a light sensitive device 230 is also provided at first (FIG.

4A). Next, a protection layer 310 is formed on the light sensitive device 230. Then, a transparent material layer 252 (FIG. 4B), an opaque stack layer 320 (FIG. 4C), another transparent material layer 252 (FIG. 4D) and another opaque stack layer 330 (FIG. 4E) are sequentially formed, and the structure of FIG. 3D can be formed by repeatedly stacking these layers. Finally, a plurality of micro-lenses 240 are formed on the light blocking stack layer 250 so as to accomplish the light sensitive device with micro-lens of the present disclosure. In this embodiment, the transparent material layer 252, the opaque stack layer 320, the transparent material layer 252 and the opaque stack layer 330 may also be formed by using the traditional semiconductor photolithography technique and thus details thereof are not repeated therein.

Figure 5:
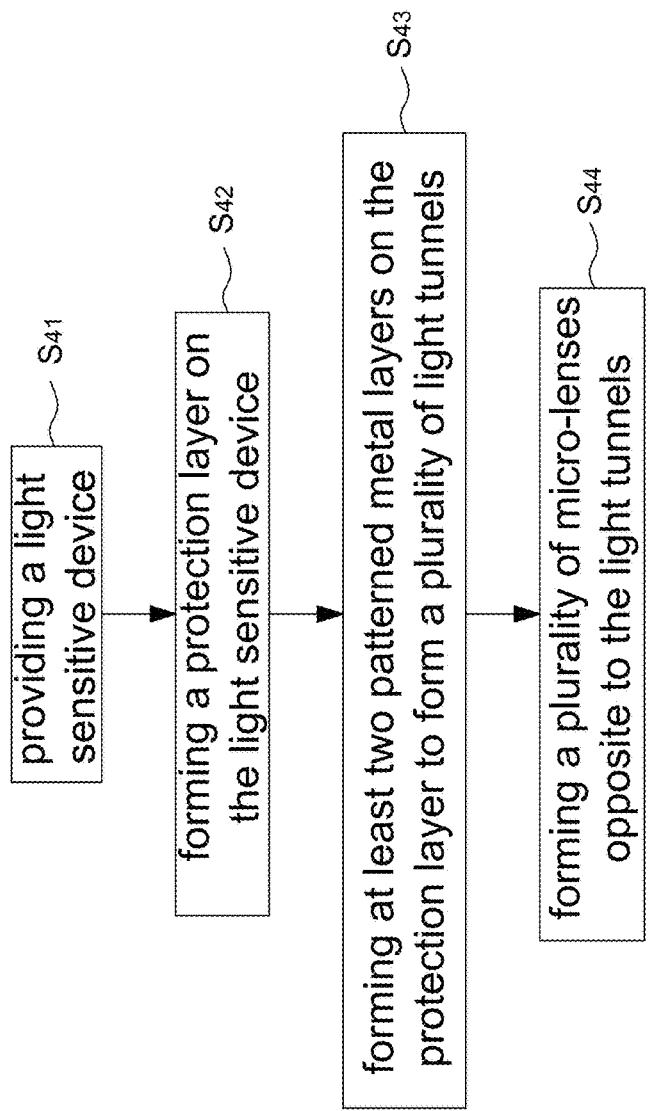
FIG. 5 shows a flow chart of the manufacturing method of the light sensitive device with micro-lens according to the embodiment of the present disclosure.

In a word, the manufacturing method of the light sensitive device with micro-lens of this embodiment includes the steps of: providing a light sensitive device (Step $S_{41}$); forming a protection layer on the light sensitive device (Step $S_{42}$); forming at least two patterned metal layers on the protection layer so as to form a plurality of light passages (Step $S_{43}$); and forming a plurality of micro-lenses opposite to the light passages (Step $S_{44}$) as shown in FIG. 5, wherein details of this embodiment are shown in FIGS. 3A-3D, FIGS. 4A-4E and the corresponding descriptions thereof and thus details are not repeated herein. It should be mentioned that although the first patterned metal layer 320 and the second patterned metal layer 330 are shown to have different shapes and sizes in FIGS. 3A-3D and FIGS. 4A-4E, but the present disclosure is not limited thereto. In another embodiment, the first patterned metal layer 320 and the second patterned metal layer 330 may substantially be identical.

It should be mentioned that although FIGS. 2B and 2C show 5 layers of the opaque stack layers 254, the present disclosure is not limited thereto. The opaque stack layers 254 may be 2-5 layers. The layer number of the opaque stack layers 254 may be determined according to the detectable range, the size of photosensitive units, the shape of micro-lenses and the system parameter.

In FIGS. 2B and 2C, the micro-lenses 240 are spherical asymmetric and a gravity center of a part of the micro-lenses (i.e. the micro-lenses not at the center of the light sensitive device 320) preferably has an offset from the associated photosensitive units 232 toward a direction away from a center of the light sensitive device 230 to effectively guide the reflected light beam L1 onto the photosensitive units 232, wherein corresponding to the tilt angle θ of the light passages C, the offset is also positively correlated with a distance between the micro-lenses 240 and the center of the light sensitive device 230.

Figure 6:
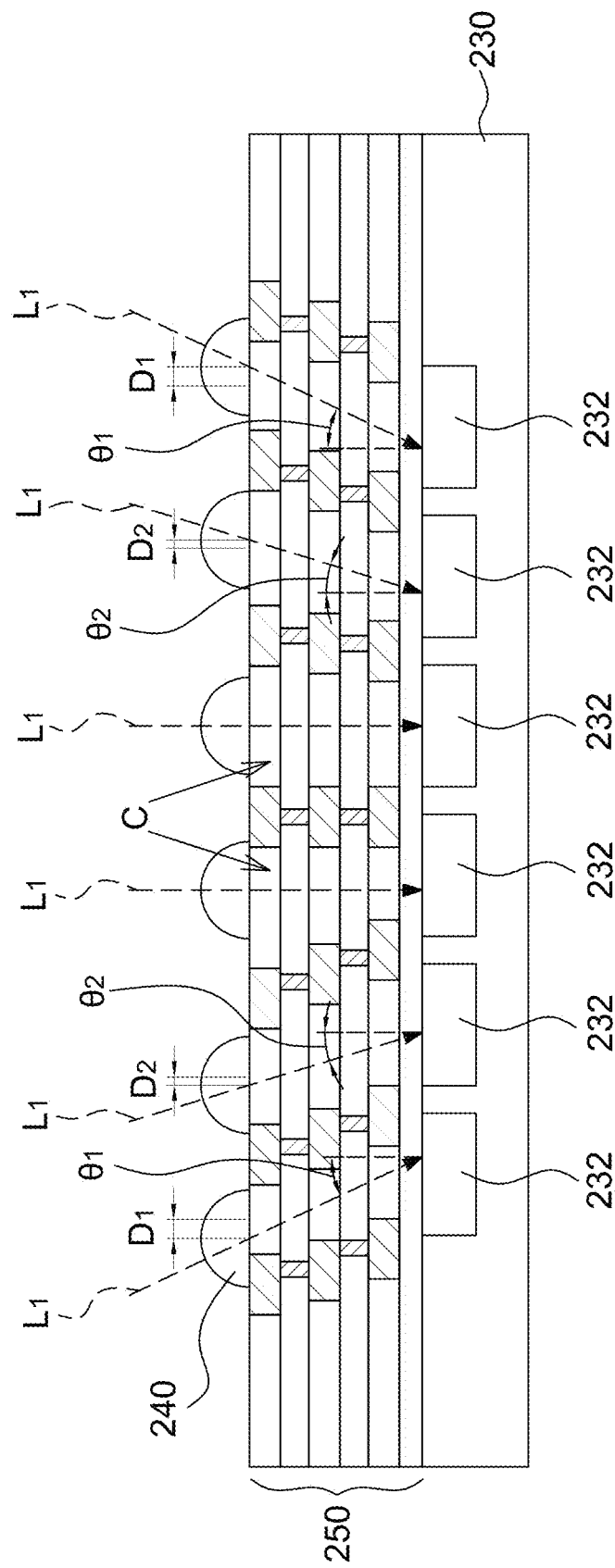
FIG. 6 shows another cross-sectional view of the optical apparatus according to an embodiment of the present disclosure.

In another embodiment, referring to FIG. 6, the micro-lenses 240 may be spherical symmetry, and a gravity center (i.e. the sphere center herein) of the micro-lenses 240 preferably has an offset from the associated photosensitive units 232 toward a direction away from a center of the light sensitive device 230, e.g. the offsets D1 and D2 shown in FIG. 6. Similarly, corresponding to the tilt angle θ of the light passages C, the offset is also positively correlated with a distance between the micro-lenses 240 and the center of the light sensitive device 230, e.g. D1>D2, so as to limit the incident angles of the reflected light beam L1 impinging on the photosensitive units 232, e.g. incident angle θ1>θ2.

As mentioned above, the optical apparatus according to the embodiment of the present disclosure (as FIG. 2A) may include corresponded micro-lenses disposed above the light sensitive device so as to prevent the use of the conventional single lens such that the fabrication of the optical apparatus is easier and the total size of the optical apparatus is reduced thereby effectively reducing the manufacturing cost of the optical apparatus. Furthermore, in the optical apparatus a light blocking stack layer is stacked around adjacent photosensitive units (as FIGS. 2B, 2C and 6) so as to limit the incident angle of reflected light beams impinging on every photosensitive unit so as to achieve the function of identifying the object movement and reduce interferences of stray light or light leakage.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed. Furthermore, any embodiment or claim of the present invention is not necessary to achieve all objects, advantages and novel features disclosed herein. Meanwhile, the summary and title are only for searching of patent documents but not to limit the scope of claims of the present disclosure.

What is claimed is:

1. An optical apparatus, configured to detect an object, the optical apparatus comprising:
    a substrate;
    a light emitting device disposed on the substrate and configured to provide a light beam;
    a light sensitive device comprising a plurality of photosensitive units arranged in matrix and having a matrix center, the light sensitive device disposed on the substrate and configured to receive a reflected light beam formed by the object reflecting the light beam; and
    a light blocking stack layer disposed on the light sensitive device and including at least two patterned metal layers, wherein
        a plurality of light passages associated with the photosensitive units is formed in the at least two patterned metal layers,
        the plurality of light passages inclines toward a direction away from the matrix center of the light sensitive device to limit an incident angle of the reflected light beam impinging on the photosensitive units, and
        tilt angles of some light passages arranged different from tilt angles of other light passages among the plurality of light passages, wherein the tilt angles of light passages farther from the matrix center of the light sensitive device are larger than the tilt angles of light passages closer to the matrix center of the light sensitive device thereby increasing sensing efficiency in specific angles.

2. The optical apparatus as claimed in claim 1, further comprising a plurality of micro-lenses disposed above the light sensitive device and respectively opposite to the photosensitive units.

3. The optical apparatus as claimed in claim 2, wherein the light blocking stack layer is between the micro-lenses and the light sensitive device.

4. The optical apparatus as claimed in claim 2, wherein the micro-lenses are spherical asymmetry.

5. The optical apparatus as claimed in claim 2, wherein a gravity center of the micro-lenses has an offset from the associated photosensitive units toward a direction away from the matrix center of the light sensitive device.

6. The optical apparatus as claimed in claim 5, wherein the offset is positively correlated with a distance between the micro-lenses and the matrix center of the light sensitive device.

7. The optical apparatus as claimed in claim 1, wherein the light blocking stack layer comprises at least two transparent material layers and at least two opaque stack layers, and the transparent material layers are configured as the light passages and the at least two opaque stack layers are configured as the at least two patterned metal layers.

8. The optical apparatus as claimed in claim 7, wherein the opaque stack layers are made of light absorbing material.

9. The optical apparatus as claimed in claim 1, wherein each of the photosensitive units is associated with one light passage.

10. The optical apparatus as claimed in claim 1, wherein each of the photosensitive units is associated with more than one light passage, and the incident angles of the reflected light beam limited by the light passages associated with the same photosensitive unit are identical.

11. The optical apparatus as claimed in claim 1, wherein each of the photosensitive units comprises at least one photodiode.

12. A light sensitive device with micro-lens, the light sensitive device comprising:
a plurality of photosensitive units arranged in a matrix which has a center;
a light blocking stack layer including at least two patterned metal layers forming on the photosensitive units to form a plurality of light passages associated with the photosensitive units respectively, wherein
a part of the plurality of light passages has a tilt angle toward a direction away from the center of the matrix, and
tilt angles of some light passages arranged different from tilt angles of other light passages among the part of the plurality of light passages, wherein the tilt angles of the part of the plurality of light passages farther from the center of the matrix are larger than tilt angles of the part of the plurality of light passages closer to the center of the matrix thereby increasing sensing efficiency in specific angles, and
a plurality of micro-lenses disposed on the light blocking stack layer and opposite to the light passages, respectively.

13. The light sensitive device as claimed in claim 12, wherein a gravity center of the micro-lenses has an offset from the associated photosensitive units toward a direction away from the center of the matrix.

14. The light sensitive device as claimed in claim 13, wherein the offset is positively correlated with a distance between the micro-lenses and the center of the matrix.

15. A light sensitive device, comprising:
a plurality of photosensitive units arranged in a matrix and having a matrix center; and
a light blocking stack layer disposed on the plurality of photosensitive units and including at least two patterned metal layers, wherein
a plurality of light passages associated with the photosensitive units is in the at least two patterned metal layers,
first light passages among the plurality of light passages are arranged at a center area of the matrix, and the first light passages do not have an tile angle,
second light passages among the plurality of light passages are arranged outside of the center area and incline toward a direction away from the matrix center, and
tilt angles of some light passages arranged different from tilt angles of other light passages among the second light passages, wherein the tilt angles of light passages farther from the matrix center are larger than the tilt angles of light passages closer to the matrix center among the second light passages thereby increasing sensing efficiency in specific angles.

16. The light sensitive device as claimed in claim 15, further comprising a plurality of micro-lenses disposed above the plurality of photosensitive units and respectively opposite to the photosensitive units.

17. The light sensitive device as claimed in claim 16, wherein the light blocking stack layer is between the micro-lenses and the plurality of photosensitive units.

18. The light sensitive device as claimed in claim 16, wherein the micro-lenses are spherical symmetry and a gravity center of the micro-lenses has an offset from the associated photosensitive units toward a direction away from the matrix center.

19. The light sensitive device as claimed in claim 18, wherein the offset is positively correlated with a distance between the micro-lenses and the matrix center.

20. The light sensitive device as claimed in claim 15, wherein each of the photosensitive units is associated with at least one of the plurality of light passages.

* * * * *